United States Patent
Zhang et al.

(10) Patent No.: US 10,951,220 B2
(45) Date of Patent: Mar. 16, 2021

(54) METHOD FOR CALIBRATING CAPACITOR VOLTAGE COEFFICIENT OF HIGH-PRECISION SUCCESSIVE APPROXIMATION ANALOG-TO-DIGITAL CONVERTER

(71) Applicant: NO.24 RESEARCH INSTITUTE OF CHINA ELECTRONICS TECHNOLOGY GROUP CORPORATION, Chongqing (CN)

(72) Inventors: Yong Zhang, Chongqing (CN); Ting Li, Chongqing (CN); Zhengbo Huang, Chongqing (CN); Yabo Ni, Chongqing (CN); Dongbing Fu, Chongqing (CN)

(73) Assignee: NO. 24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 0 days.

(21) Appl. No.: 16/620,879

(22) PCT Filed: Jul. 18, 2018

(86) PCT No.: PCT/CN2018/096085
§ 371 (c)(1),
(2) Date: Dec. 10, 2019

(87) PCT Pub. No.: WO2019/184149
PCT Pub. Date: Oct. 3, 2019

(65) Prior Publication Data
US 2021/0013896 A1    Jan. 14, 2021

(30) Foreign Application Priority Data

Mar. 27, 2018  (CN) .......................... 201810258394.9

(51) Int. Cl.
*H03M 1/10* (2006.01)
*H03M 1/06* (2006.01)

(52) U.S. Cl.
CPC ........ *H03M 1/1009* (2013.01); *H03M 1/0612* (2013.01); *H03M 1/0641* (2013.01)

(58) Field of Classification Search
CPC . H03M 1/1009; H03M 1/0641; H03M 1/0612
See application file for complete search history.

(56) References Cited

U.S. PATENT DOCUMENTS 10,623,010 B2 *   4/2020   Loke .................... H03M 1/183
10,715,163 B2 *   7/2020   Chao ................... H03M 1/1033
(Continued)

FOREIGN PATENT DOCUMENTS

| CN | 102594353 A | 7/2012 |
| CN | 105245231 A | 1/2016 |
| CN | 107769784 A | 3/2018 |

OTHER PUBLICATIONS

宋健等 (Song, Jian et al.) "高速高精度 SAR ADC 电容电压系数校正 (Capacitor Voltage Coefficient Correction for High Speed and High Resolution SAR ADC)" 微电子学 (Microelectronics) vol. 47, No. 6, Dec. 31, 2017(Dec. 31, 2017). ISSN:1004-3365, sections 1 and 2.

*Primary Examiner* — Brian K Young

(57) ABSTRACT

The present disclosure relates to the field of semiconductor integrated circuits, and to a method for calibrating a capacitor voltage coefficient of a high-precision successive approximation analog-to-digital converter (SAR ADC). The method includes: calibrating a voltage coefficient; obtaining a sampled charged charge according to a capacitance model with the voltage coefficient; according to an INL value obtained by testing, first verifying whether a maximum value of INL occurs in the place shown in Equation 3, then obtaining two very close second-order capacitor voltage (Continued)

coefficients according to Equation 4, and taking an average value thereof as a second-order capacitor voltage coefficient; and then calibrating the second-order capacitor voltage coefficient in a digital domain. In the present disclosure, a capacitor voltage coefficient can be extracted based on INL and the capacitor voltage coefficient is calibrated at a digital backend without adding an analog calibration circuit, thereby improving conversion accuracy of the ADC.

1 Claim, 3 Drawing Sheets

(56) References Cited

U.S. PATENT DOCUMENTS 10,804,919 B1 * 10/2020 Cranford ............. H03M 1/0612
2017/0357219 A1    12/2017 Chiu et al.

* cited by examiner

METHOD FOR CALIBRATING CAPACITOR VOLTAGE COEFFICIENT OF HIGH-PRECISION SUCCESSIVE APPROXIMATION ANALOG-TO-DIGITAL CONVERTER

CROSS REFERENCES TO RELATED APPLICATIONS

This is a Sect. 371 National Stage of PCT International Application No. PCT/CN2018/096085, filed on 18 Jul. 2018, which claims priority of a Chinese Patent Application No. 201810258394.9 filed on 9 Apr. 2018, the contents of both applications hereby being incorporated by reference in their entireties for all purposes.

BACKGROUND OF THE PRESENT DISCLOSURE

Field of Disclosure

The present disclosure relates to the field of semiconductor integrated circuits, and in particular to a method for calibrating a capacitor voltage coefficient of a high-precision successive approximation analog-to-digital converter (SAR ADC).

Description of Related Arts

In a traditional SAR ADC, successive approximation logic determines a level connected to the upper pole plate of the capacitor bit by bit from a high-order bit to a low-order bit. The charge is redistributed. If the capacitor has a voltage coefficient, a nonlinear charge participates in the redistribution, and a conversion result leads to nonlinearity and reduces conversion accuracy of the converter. In a current calibration method, a capacitor voltage coefficient is measured and calibrated based on the addition of an analog circuit, which increases complexity of the circuit.

SUMMARY OF THE PRESENT DISCLOSURE

In view of this, the present disclosure provides a method for calibrating a capacitor voltage coefficient of a high-precision SAR ADC, to extract a capacitor voltage coefficient based on integral nonlinearity (INL) and calibrate the capacitor voltage coefficient at a digital backend without adding an analog calibration circuit, thereby improving conversion accuracy of the ADC.

The present disclosure provides a method for calibrating a capacitor voltage coefficient of a high-precision SAR ADC, including the following steps:

calibrating a voltage coefficient, a capacitance model with the voltage coefficient is shown in Equation 1:

$$C = C_0 * (1 + \alpha_1 * V + \alpha_2 * V^2 + \ldots) \quad (1)$$

where C is an actual value of a capacitor, $C_0$ is a nominal value of the capacitor when a voltage difference between two ends of the capacitor is 0, $\alpha_1$ is a first-order capacitor voltage coefficient, V is a voltage difference between the two ends of the capacitor, and $\alpha_2$ is a second-order capacitor voltage coefficient;

sampling to obtain a charged charge:

$$Q = C_0 * (V + 0.5 * \alpha_1 * V^2 + \tfrac{1}{3} * \alpha_2 * V^3 + \ldots) \quad (2)$$

where because the ADC uses a differential structure, a related term $0.5 * \alpha_1 * V^2$ of the first-order voltage coefficient is canceled during sampling; if a high-order capacitor voltage coefficient is omitted, a related term $\tfrac{1}{3} * \alpha_2 * V^3$ of the second-order capacitor voltage coefficient becomes a dominant factor of nonlinearity, and the second-order capacitor voltage coefficient is extracted and calibrated according to an integral nonlinearity (INL) curve of the ADC; and the shape of the INL curve is determined by the second-order voltage coefficient, and a digital code for generating maximum INL is shown in Equation 3:

$$Dout1 = min(Dout)/\sqrt{3}$$

$$Dout2 = max(Dout)/\sqrt{3} \quad (3)$$

where Dout is an output digital code of the ADC, a value at a minimum value of INL in a negative value range of Dout is set to Dout1, a value at a maximum value of INL in a positive value range of Dout is set to Dout2, min(Dout) represents a minimum value of Dout, and max(Dout) represents a maximum value of Dout; and a maximum INL value is shown in Equation 4:

$$max(INL) = 2 * \alpha_{21} * (max(Dout))^3 / 3^{2.5}$$

$$min(INL) = 2 * \alpha_{22} * (min(Dout))^3 / 3^{2.5} \quad (4)$$

where max(INL) represents the maximum value of INL, min(INL) represents the minimum value of INL, $\alpha_{21}$ represents a second-order voltage coefficient value derived from the maximum value of INL, and $\alpha_{22}$ represents a second-order voltage coefficient value derived from the minimum value of INL;

according to an INL value obtained by testing, first verifying whether a maximum value of INL occurs in the place shown in Equation 3, then obtaining two very close second-order capacitor voltage coefficients according to Equation 4, and taking an average value thereof as a second-order capacitor voltage coefficient, as shown in Equation 5:

$$\alpha_2 = \frac{\alpha_{21} + \alpha_{22}}{2}; \quad (5)$$

and then calibrating the second-order capacitor voltage coefficient in a digital domain, a calibration formula is shown in Equation 6:

$$Dout\_cal = Dout - \tfrac{1}{3} * \alpha_2 * Dout^3 \quad (6)$$

where Dout_cal is a calibrated ADC digital output code.

The present disclosure has the following beneficial effects: in the present disclosure, a capacitor voltage coefficient can be extracted based on INL and the capacitor voltage coefficient is calibrated at a digital backend without adding an analog calibration circuit, thereby improving the conversion accuracy of the ADC.

BRIEF DESCRIPTION OF THE DRAWINGS

In order to make the object, the technical solution and the beneficial effects of the present disclosure clearer, the present disclosure provides the following drawings for description.

DETAILED DESCRIPTION OF THE PREFERRED EMBODIMENTS

The preferred embodiments of the present disclosure are described in detail below with reference to the accompanying drawings.

Figure 1:
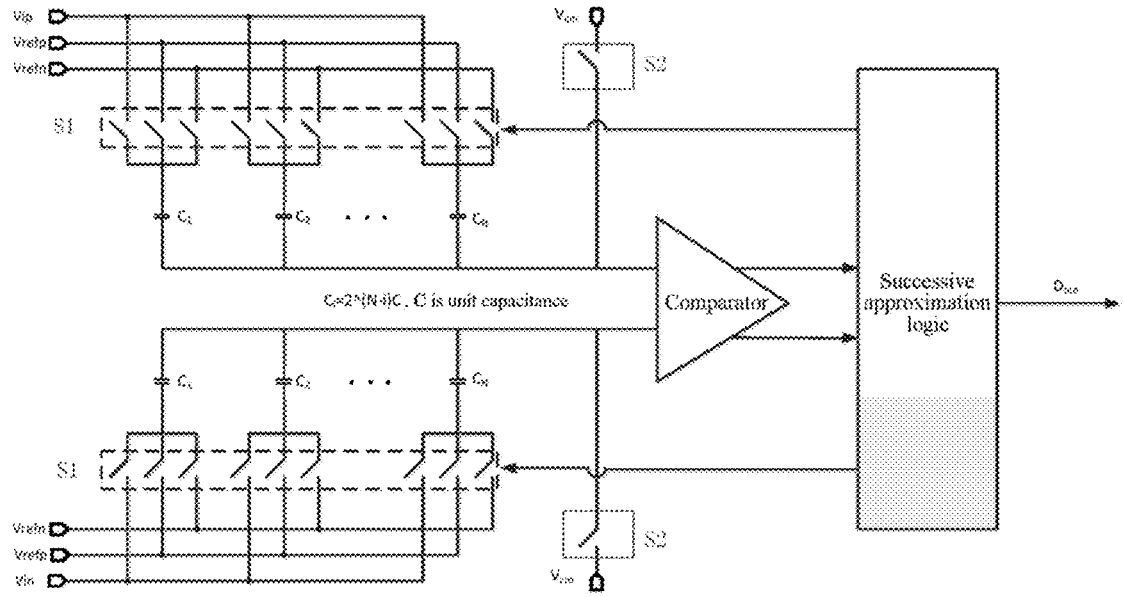
FIG. 1 shows an N-bit SAR ADC.

FIG. 1 shows a circuit structure of a SAR ADC. An N-bit SAR ADC includes N binary weight capacitors. During phase sampling, a switch connected to input signals Vip and Vin in a switch S1 is turned on. A switch S2 is turned on, an upper pole plate of the capacitor is connected to the input signal, and a lower pole plate of the capacitor is connected to a common mode level. If the capacitor has a voltage coefficient, a sampled charge also has nonlinearity. After the sampling is completed, a conversion phase is entered, the switch connected to the input signals Vip and Vin in the switch S1 is disconnected, the switch S2 is disconnected, and the lower pole plate of the capacitor is unconnected.

As shown in FIG. 1, a capacitor voltage coefficient affects the sampling accuracy of the signal, thereby constraining the linearity of the SAR ADC. In order to obtain a higher signal-to-noise ratio, the voltage coefficient needs to be calibrated. A capacitance model with the voltage coefficient is shown in Equation 1:

$$C=C_0*(1+\alpha 1*V+\alpha 2*V^2+\ldots) \quad (1)$$

A charged charge is sampled as:

$$Q=C_0*(V+0.5*\alpha 1*V^2+\tfrac{1}{3}*\alpha 2*V^3+\ldots) \quad (2)$$

Figure 2:
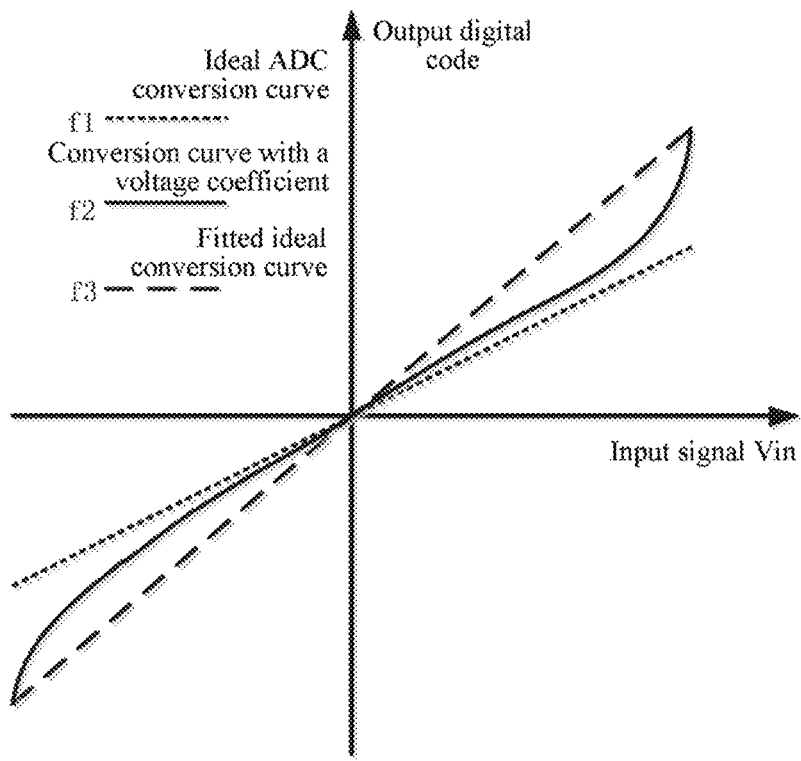
FIG. 2 shows input and output characteristics of the successive approximation ADC.
Figure 3:
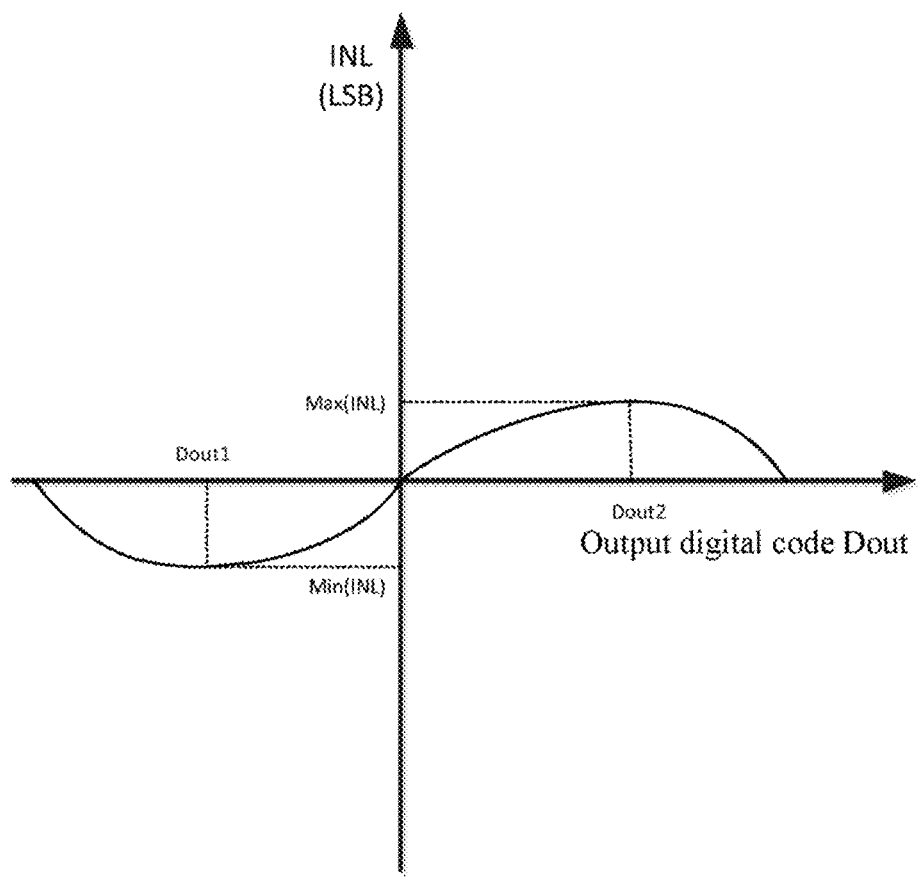
FIG. 3 is an INL graph introduced by a capacitor voltage coefficient.

Because the ADC uses a differential structure, a related term $0.5*\alpha 1*V^2$ of a first-order voltage coefficient is canceled during sampling. If a high-order capacitor voltage coefficient is omitted, a related term $\tfrac{1}{3}*\alpha 2*V^3$ of a second-order capacitor voltage coefficient becomes a dominant factor of nonlinearity. In the present disclosure, the second-order capacitor voltage coefficient is extracted and calibrated according to an INL curve of the ADC. FIG. 2 shows a graph of input and output characteristics of the ADC. If the ADC is an ideal device, transmission characteristics thereof are shown by a dotted line f1. However, if a capacitor in the ADC has a voltage coefficient, a very large error is introduced to a large input signal during sampling, and a transmission curve thereof is shown by a solid line f2, and nonlinearity appears. A dashed line f3 represents an ideal conversion curve after fitting of two ends, INL is obtained by the subtraction of f2 and f3, and the shape of INL is shown in FIG. 3. It can be learned that the shape of the INL curve is determined by a second-order voltage coefficient, and a digital code for generating the maximum INL is shown in Equation 3:

$$Dout1=\min(Dout)/\sqrt{3}$$

$$Dout2=\max(Dout)/\sqrt{3} \quad (3)$$

A maximum INL value is shown in Equation 4:

$$\max(INL)=2*\alpha 21*(\max(Dout))^3/3^{2.5}$$

$$\min(INL)=2*\alpha 22*(\min(Dout))^3/3^{2.5} \quad (4)$$

According to an INL value obtained by testing, whether a maximum value of INL occurs in the place shown in Equation 3 is first verified, then two very close second-order capacitor voltage coefficients can be obtained according to Equation 4, and an average value thereof is taken as a second-order capacitor voltage coefficient, as shown in Equation 5:

$$\alpha 2 = \frac{\alpha 21 + \alpha 22}{2} \quad (5)$$

Then the second-order capacitor voltage coefficient is calibrated in a digital domain, a calibration formula is shown in Equation 6:

$$Dout\_cal=Dout-\tfrac{1}{3}*\alpha 2*Dout^3 \quad (6)$$

Figure 4:
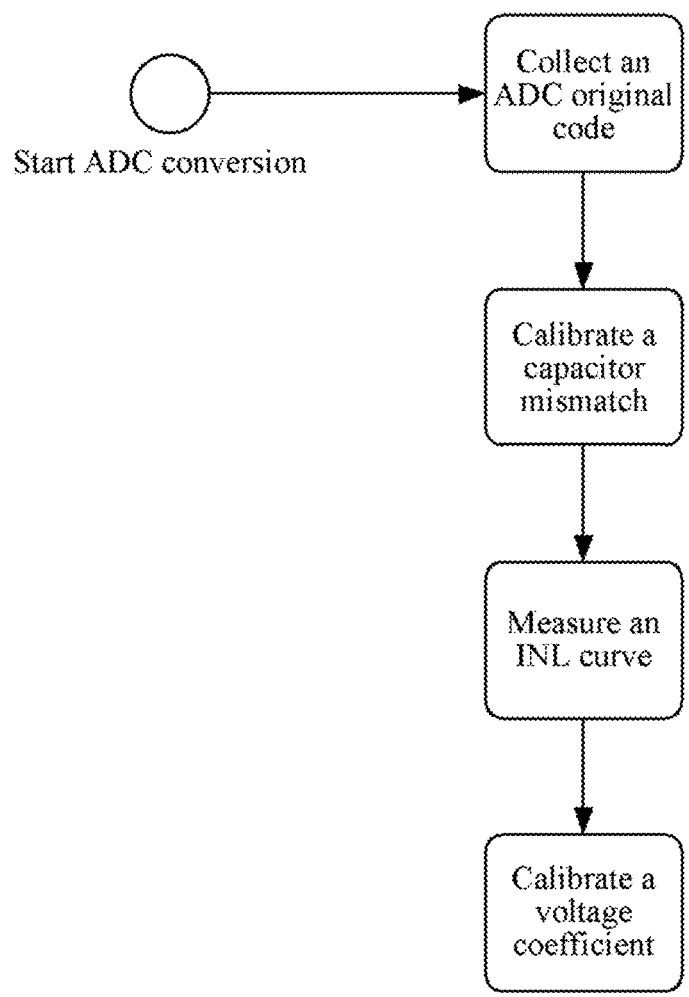
FIG. 4 shows a calibration process of a capacitor voltage coefficient.

In the present disclosure, the capacitor voltage coefficient is extracted according to the INL test curve. This requires the INL curve to fully represent information about the capacitor voltage coefficient. Therefore, before the voltage coefficient is calibrated, capacitor weight calibration needs to be performed to eliminate an error of a capacitor mismatch, and a calibration process is shown in FIG. 4. In a first step, original code information of the ADC is collected, in the second step, the calibration of the capacitor mismatch is completed according to the collected original code, in the third step, the INL curve after the mismatch is calibrated is tested, and in the final step, the second-order capacitor voltage coefficient is obtained according to the INL curve obtained by testing, and the second-order capacitor voltage coefficient is calibrated in the digital domain.

Finally, it should be noted that the foregoing preferred embodiments are merely intended for illustrating rather than limiting the technical solution of the present disclosure. Although the present disclosure has been described in detail through the foregoing preferred embodiments, those skilled in the art should understand that various alterations may be performed to the form and details of the present disclosure without departing from the scope defined by the claims of the present disclosure.

What is claimed is:

1. A method for calibrating a capacitor voltage coefficient of a high-precision successive approximation analog-to-digital converter (SAR ADC), comprising:

calibrating a voltage coefficient, a capacitance model with the voltage coefficient is shown in Equation 1:

$$C=C_0*(1+\alpha 1*V+\alpha 2*V^2+\ldots) \quad (1)$$

wherein C is an actual value of a capacitor, $C_0$ is a nominal value of the capacitor when a voltage difference between two ends of the capacitor is 0, $\alpha 1$ is a first-order capacitor voltage coefficient, V is a voltage difference between the two ends of the capacitor, and $\alpha 2$ is a second-order capacitor voltage coefficient; sampling to obtain a charged charge:

$$Q=C_0*(V+0.5*\alpha 1*V^2+\tfrac{1}{3}*\alpha 2*V^3+\ldots) \quad (2)$$

wherein the ADC uses a differential structure, a related term $0.5*\alpha 1*V^2$ of the first-order voltage coefficient is canceled during sampling; if a high-order capacitor voltage coefficient is omitted, a related term $\tfrac{1}{3}*\alpha 2*V^3$ of the second-order capacitor voltage coefficient becomes a dominant factor of nonlinearity, and the second-order capacitor voltage coefficient is extracted and calibrated according to an integral nonlinearity (INL) curve of the ADC; and the shape of the INL curve is determined by the second-order voltage coefficient, and a digital code for generating maximum INL is shown in Equation 3:

$$Dout1 = \min(Dout)/\sqrt{3}$$

$$Dout2 = \max(Dout)/\sqrt{3} \quad (3)$$

wherein Dout is an output digital code of the ADC, a value at a minimum value of INL in a negative value range of Dout is set to Dout1, a value at a maximum value of INL in a positive value range of Dout is set to Dout2, min(Dout) represents a minimum value of Dout, and max(Dout) represents a maximum value of Dout; and a maximum INL value is shown in Equation 4:

$$\max(INL) = 2*\alpha 21*(\max(Dout))^3/3^{2.5}$$

$$\min(INL) = 2*\alpha 22*(\min(Dout))^3/3^{2.5} \quad (4)$$

wherein max(INL) represents the maximum value of INL, min(INL) represents the minimum value of INL, $\alpha 21$ represents a second-order voltage coefficient value derived from the maximum value of INL, and $\alpha 22$ represents a second-order voltage coefficient value derived from the minimum value of INL;

according to an INL value obtained by testing, first verifying whether a maximum value of INL occurs in the place shown in Equation 3, then obtaining two very close second-order capacitor voltage coefficients according to Equation 4, and taking an average value thereof as a second-order capacitor voltage coefficient, as shown in Equation 5:

$$\alpha 2 = \frac{\alpha 21 + \alpha 22}{2}; \quad (5)$$

and then calibrating the second-order capacitor voltage coefficient in a digital domain, a calibration formula is shown in Equation 6:

$$Dout\_cal = Dout - \tfrac{1}{3}*\alpha 2*Dout^3 \quad (6)$$

wherein Dout_cal is a calibrated ADC digital output code.

* * * * *